United States Patent
Mukuno

(10) Patent No.: US 11,125,829 B2
(45) Date of Patent: Sep. 21, 2021

(54) MANAGEMENT DEVICE, AND POWER STORAGE SYSTEM

(71) Applicant: Panasonic Intellectual Property Management Co., Ltd., Osaka (JP)

(72) Inventor: Mamoru Mukuno, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 260 days.

(21) Appl. No.: 16/326,048

(22) PCT Filed: Sep. 7, 2017

(86) PCT No.: PCT/JP2017/032255
§ 371 (c)(1),
(2) Date: Feb. 15, 2019

(87) PCT Pub. No.: WO2018/051885
PCT Pub. Date: Mar. 22, 2018

(65) Prior Publication Data
US 2019/0187221 A1 Jun. 20, 2019

(30) Foreign Application Priority Data
Sep. 13, 2016 (JP) .............................. JP2016-178916

(51) Int. Cl.
*G01R 31/396* (2019.01)
*H01M 10/48* (2006.01)
(Continued)

(52) U.S. Cl.
CPC .............. *G01R 31/396* (2019.01); *B60L 3/12* (2013.01); *B60L 58/14* (2019.02); *B60L 58/15* (2019.02);
(Continued)

(58) Field of Classification Search
CPC .... G01R 31/396; G01R 31/36; G01R 31/367; H01M 10/48; H01M 10/42; B60L 3/12;
(Continued)

(56) References Cited

U.S. PATENT DOCUMENTS

| 2013/0158917 | A1 | 6/2013 | Uchida | |
| 2013/0187613 | A1* | 7/2013 | Tonegawa | H02J 3/322 320/128 |

(Continued)

FOREIGN PATENT DOCUMENTS

| CN | 102959420 A | 3/2013 |
| JP | 2013-195129 | 9/2013 |

OTHER PUBLICATIONS

International Search Report of PCT application No. PCT/JP2017/032255 dated Dec. 5, 2017.
(Continued)

*Primary Examiner* — Manuel A Rivera Vargas
(74) *Attorney, Agent, or Firm* — McDermott Will and Emery LLP

(57) ABSTRACT

In a management device that manages a power storage module, a voltage measuring unit measures n pieces of voltages across respective n power storage blocks. A ranking unit assigns ranks to the voltages measured across the n power storage blocks in descending order from high to low or in ascending order from low to high. A frequency distribution data generator compiles ranks assigned to voltages measured across the respective n power storage blocks during a set period and generates data about frequency distribution of the ranks for the measured voltages. An abnormality determiner detects an abnormality when information about the ranks differs from information about ranks for the power storage blocks in a normal state.

11 Claims, 5 Drawing Sheets

(51) Int. Cl.
  *H01M 10/42* (2006.01)
  *G01R 31/36* (2020.01)
  *B60L 58/25* (2019.01)
  *B60L 3/12* (2006.01)
  *B60L 58/21* (2019.01)
  *B60L 58/15* (2019.01)
  *B60L 58/14* (2019.01)
  *B60L 58/22* (2019.01)
  *G01R 31/3835* (2019.01)
  *H02J 7/00* (2006.01)
  *H03K 5/24* (2006.01)

(52) U.S. Cl.
  CPC .............. *B60L 58/21* (2019.02); *B60L 58/22* (2019.02); *B60L 58/25* (2019.02); *G01R 31/36* (2013.01); *G01R 31/3648* (2013.01); *G01R 31/3835* (2019.01); *H01M 10/42* (2013.01); *H01M 10/48* (2013.01); *H02J 7/0021* (2013.01); *H03K 5/24* (2013.01); *H02J 7/0016* (2013.01)

(58) Field of Classification Search
  CPC ..... H02J 7/0021; H02J 2310/48; Y02E 60/10; Y02T 10/70
  See application file for complete search history.

(56) References Cited

U.S. PATENT DOCUMENTS

2014/0008980 A1\* 1/2014 Ito ................... H02J 7/007184
  307/29
2017/0351427 A1\* 12/2017 Klein ................... G06F 3/0688

OTHER PUBLICATIONS

English Translation of Chinese Office Action dated Nov. 2, 2020 for the related Chinese Patent Application No. 201780050900.9.

\* cited by examiner

FIG. 3

| | | | | |
|---|---|---|---|---|
| SOC segment 1 | Low temperature range | Charge | Current seg 1 | Ref frequency distro 1 |
| | | | Current seg 2 | Ref frequency distro 2 |
| | | Discharge | Current seg 1 | Ref frequency distro 3 |
| | | | Current seg 2 | Ref frequency distro 4 |
| | Normal temperature range | Charge | Current seg 1 | Ref frequency distro 5 |
| | | | Current seg 2 | Ref frequency distro 6 |
| | | Discharge | Current seg 1 | Ref frequency distro 7 |
| | | | Current seg 2 | Ref frequency distro 8 |
| SOC segment 2 | Low temperature range | Charge | Current seg 1 | Ref frequency distro 9 |
| | | | Current seg 2 | Ref frequency distro10 |
| | | Discharge | Current seg 1 | Ref frequency distro11 |
| | | | Current seg 2 | Ref frequency distro12 |
| | Normal temperature range | Charge | Current seg 1 | Ref frequency distro13 |
| | | | Current seg 2 | Ref frequency distro14 |
| | | Discharge | Current seg 1 | Ref frequency distro15 |
| | | | Current seg 2 | Ref frequency distro16 |
| SOC segment 3 | Low temperature range | Charge | Current seg 1 | Ref frequency distro17 |
| | | | Current seg 2 | Ref frequency distro18 |
| | | Discharge | Current seg 1 | Ref frequency distro19 |
| | | | Current seg 2 | Ref frequency distro20 |
| | Normal temperature range | Charge | Current seg 1 | Ref frequency distro21 |
| | | | Current seg 2 | Ref frequency distro22 |
| | | Discharge | Current seg 1 | Ref frequency distro23 |
| | | | Current seg 2 | Ref frequency distro24 |
| SOC segment 4 | Low temperature range | Charge | Current seg 1 | Ref frequency distro25 |
| | | | Current seg 2 | Ref frequency distro26 |
| | | Discharge | Current seg 1 | Ref frequency distro27 |
| | | | Current seg 2 | Ref frequency distro28 |
| | Normal temperature range | Charge | Current seg 1 | Ref frequency distro29 |
| | | | Current seg 2 | Ref frequency distro30 |
| | | Discharge | Current seg 1 | Ref frequency distro31 |
| | | | Current seg 2 | Ref frequency distro32 |
| SOC segment 5 | Low temperature range | Charge | Current seg 1 | Ref frequency distro33 |
| | | | Current seg 2 | Ref frequency distro34 |
| | | Discharge | Current seg 1 | Ref frequency distro35 |
| | | | Current seg 2 | Ref frequency distro36 |
| | Normal temperature range | Charge | Current seg 1 | Ref frequency distro37 |
| | | | Current seg 2 | Ref frequency distro38 |
| | | Discharge | Current seg 1 | Ref frequency distro39 |
| | | | Current seg 2 | Ref frequency distro40 |

When control for equalizing is completed.

MANAGEMENT DEVICE, AND POWER STORAGE SYSTEM

CROSS-REFERENCE TO RELATED APPLICATIONS

This application is a U.S. national stage application of the PCT International Application No. PCT/JP2017/032255 filed on Sep. 7, 2017, which claims the benefit of foreign priority of Japanese patent application No. 2016-178916 filed on Sep. 13, 2016, the contents all of which are incorporated herein by reference.

TECHNICAL FIELD

The present invention relates to a management device for managing a power storage module and to a power storage system.

BACKGROUND ART

In recent years, secondary batteries such as lithium ion batteries and nickel hydride batteries have been used for various purposes. The secondary battery is used for, for example, an on-vehicle purpose for supplying electric power to a drive motor of an electric vehicle (EV), a hybrid electric vehicle (HEV), or a plug-in hybrid vehicle (PHV), a power storage for a peak-shift or a backup, and a frequency regulation (FR) for frequency stabilization of a system, and the like. A power storage module that suits any of these purposes includes a plurality of power storage blocks connected in series, each of the power storage blocks having a plurality of parallel-connected cells. Such power storage modules having multi-parallel serial connection have come into widespread use.

When an abnormality occurs in one of the cells forming a power storage block in a power storage module having multi-parallel serial connection, it is difficult to immediately detect the abnormality. For example, even when a failure such as a blown fuse causes a break in a cell in a power storage block, other cells connected in parallel with the cell in question prevent the voltage of the power storage block from dropping immediately and rapidly. Further, when a minute short circuit occurs in a cell in a power storage block, the voltage of the power storage block does not drop immediately and rapidly.

A method for detecting an abnormal cell involves monitoring voltages of a plurality of power storage blocks and determining the occurrence of an abnormal cell in a power storage block whose voltage has made a deviation greater than or equal to a threshold. Another method involves monitoring a difference in internal resistance between power storage blocks and an overall module and determining the occurrence of an abnormal cell in a power storage block when the difference exceeds a threshold (for example, refer to PTL 1).

CITATION LIST

Patent Literature

PTL 1: Unexamined Japanese Patent Publication No. 2013-195129

SUMMARY OF THE INVENTION

The above-described methods for detecting a power storage block containing an abnormal cell by assessing whether or not a difference in voltage or internal resistance value exceeds a threshold necessitate specifying a somewhat high threshold to avoid false detection, which results in much time taken before detection of abnormality. Control for equalizing voltages among power storage blocks corrects voltage differences among the power storage blocks. This can lead to no detection of abnormality in some cases.

The present invention has been accomplished in view of the problems above, and it is an object of the present invention to provide a technique for detecting a power storage block containing an abnormal cell in a short period of time with high accuracy.

A management device according to an aspect of the present invention, accomplished to solve the problems described above, is configured to manage a power storage module including n power storage blocks series-connected, where n is an integer greater than or equal to 2, each of the power storage blocks containing m power storage cells parallel-connected, where m is an integer greater than or equal to 1. The management device includes a voltage measuring unit to measure n pieces of voltages across the n power storage blocks, a ranking unit to assign ranks to the voltages measured across the n power storage blocks in descending order from high to low or in ascending order from low to high, and a determiner to detect an abnormality when information about the ranks differs from information about ranks for the power storage blocks in a normal state.

Any desired combinations of the above-described components and converted expressions of the present invention in methods, devices, systems, and other similar entities are still effective as aspects of the present invention.

A technique according to the present invention enables detection of a power storage block containing an abnormal cell in a short period of time with high accuracy.

BRIEF DESCRIPTION OF DRAWINGS

FIG. 3 is a diagram illustrating an example of states categorized for a battery block.

DESCRIPTION OF EMBODIMENT

Figure 1:
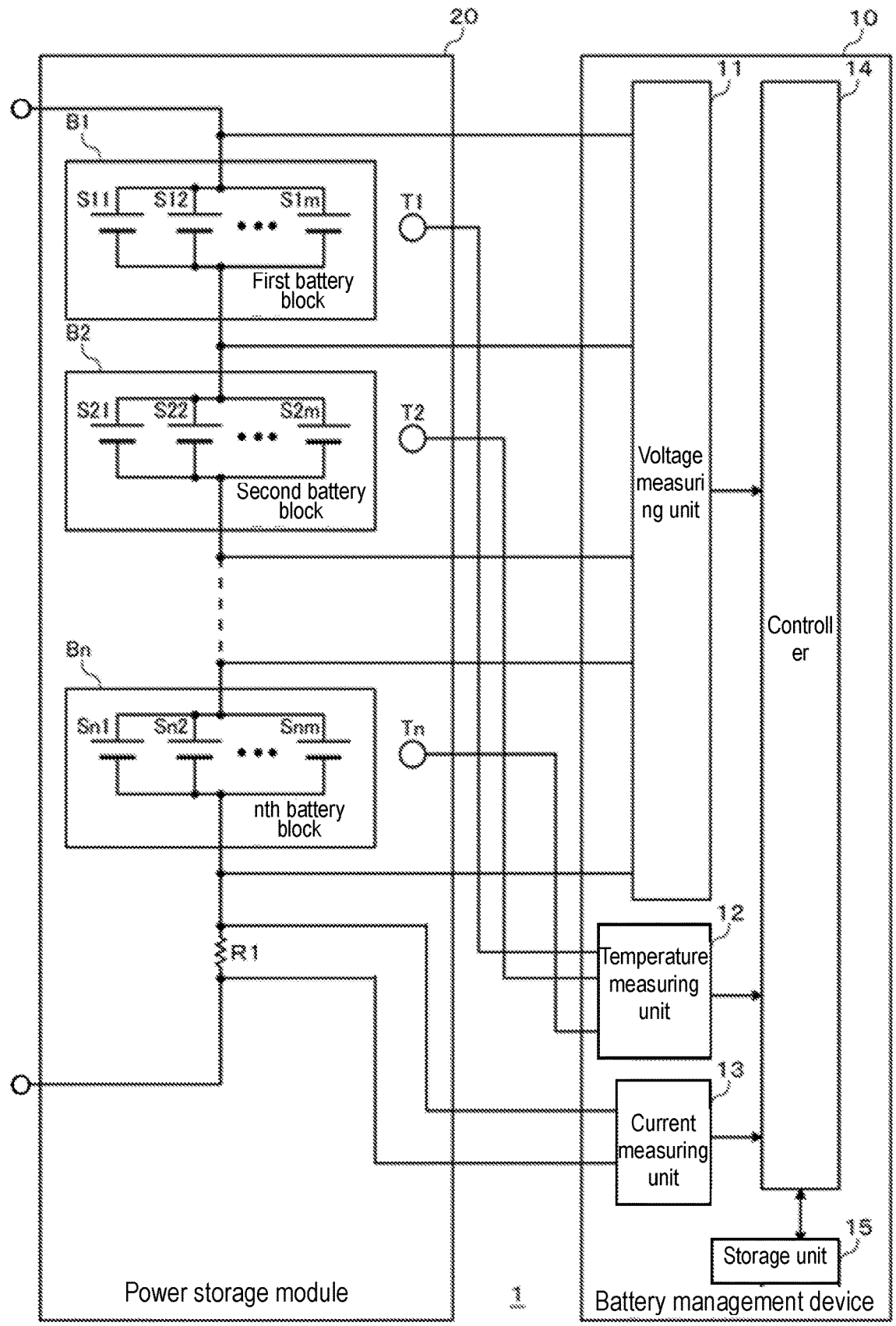
FIG. 1 is a diagram illustrating an example configuration of a power storage system according to an exemplary embodiment of the present invention.

FIG. 1 is a diagram illustrating an example configuration of power storage system 1 according to an exemplary embodiment of the present invention. Power storage system 1 includes power storage module 20 and battery management device 10. Power storage module 20 includes n (n is an integer greater than or equal to 2) battery blocks (first battery block B1, second battery block B2, . . . , nth battery block Bn) connected in series. First battery block B1 includes m (m is an integer greater than or equal to 1) battery cells S11 to S1m connected in parallel. Similarly, each of second battery block B2 and nth battery block Bn includes m parallel-connected battery cells. Examples of the battery cells include lithium ion battery cells, nickel hydride battery cells, and lead battery cells. Herein, the battery cells are assumed to be lithium ion battery cells, for example. In FIG. 1, one power storage module 20 is shown. However, power storage module 20 may be connected in series with a plurality of other power storage modules to increase output voltage.

Shunt resistor R1 serving as a current detection element is connected in series with the plurality of battery blocks B1, B2, . . . , Bn. A plurality of thermistors T1, T2, . . . , Tn serving as temperature detection elements is disposed near the plurality of respective battery blocks B1, B2, . . . , Bn. A number of the disposed thermistors may be less than a number of the battery blocks. For example, one thermistor may be disposed for two battery blocks.

Battery management device 10 includes voltage measuring unit 11, temperature measuring unit 12, current measuring unit 13, controller 14, and storage unit 15. Voltage measuring unit 11 measures voltages across the plurality of respective battery blocks B1, B2, . . . , Bn at predetermined sampling intervals (for example, 1 second intervals) and outputs measured voltages to controller 14. Voltage measuring unit 11, for example, includes a differential amplifier and an analog-digital (AD) converter.

Temperature measuring unit 12 measures temperatures of the plurality of battery blocks B1, B2, . . . , Bn based on values sent from the plurality of respective thermistors T1, T2, . . . , Tn and outputs measured temperatures to controller 14. Temperature measuring unit 12, for example, includes a voltage dividing resistor, a differential amplifier and an AD converter. Current measuring unit 13 measures a value of electric current flowing through power storage module 20 based on a voltage across both ends of shunt resistor R1 and outputs the measured current value to controller 14. Current measuring unit 13, for example, includes a differential amplifier and an AD converter.

Figure 2:
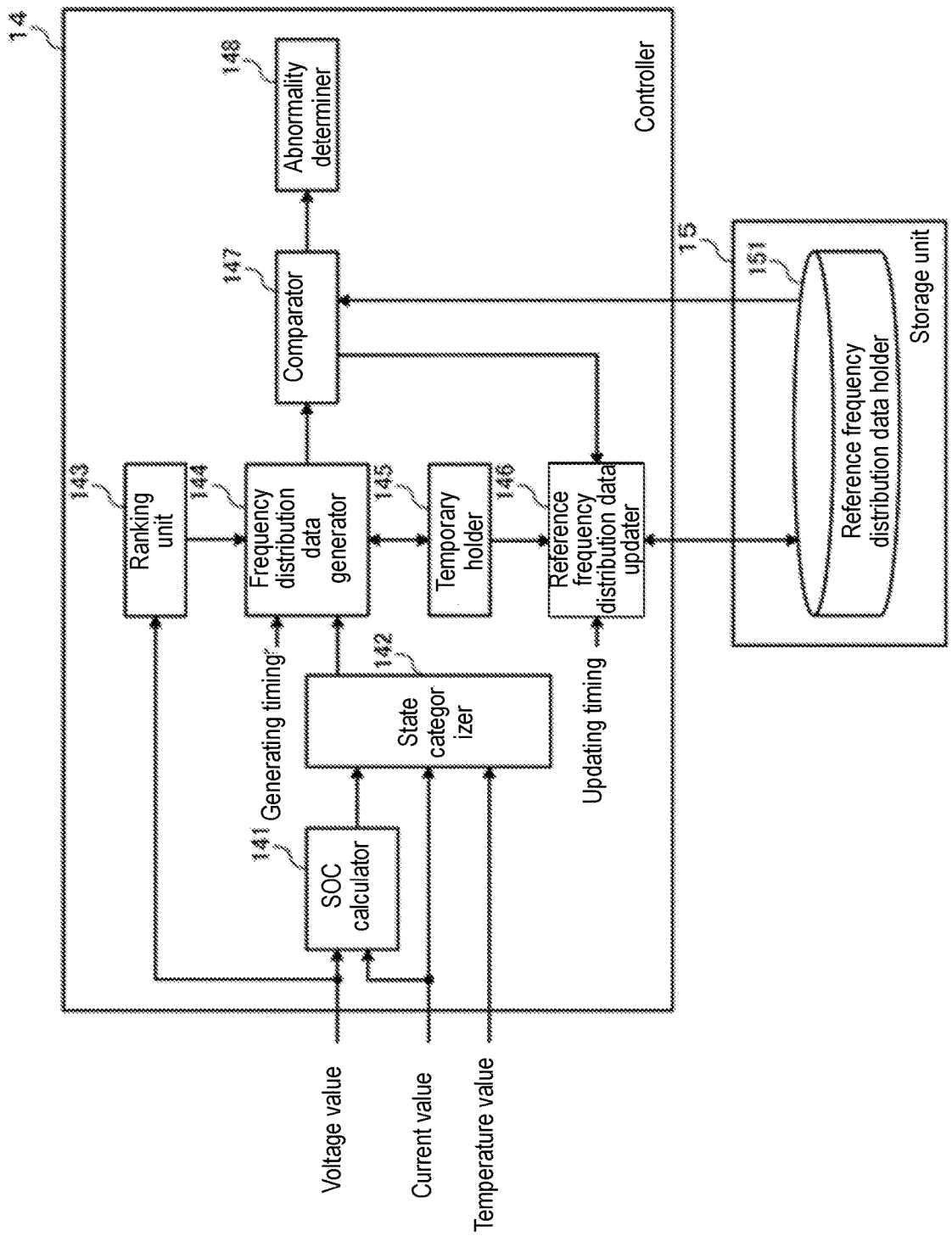
FIG. 2 is a diagram illustrating an example configuration of a controller and a storage unit in FIG. 1.

FIG. 2 is a diagram illustrating an example configuration of controller 14 and storage unit 15 in FIG. 1. Controller 14 includes state-of-charge (SOC) calculator 141, state categorizer 142, ranking unit 143, frequency distribution data generator 144, temporary holder 145, reference frequency distribution data updater 146, comparator 147, and abnormality determiner 148. Controller 14 may be composed of hardware and software resources working together or hardware resources alone. Available hardware resources include microcomputers, digital signal processors (DSPs), field-programmable gate arrays (FPGAs), read-only memory (ROM), random-access memory (RAM), and other large-scale integrated circuits (LSIs). The software resource may be a program or other firmware. Storage unit 15 includes reference frequency distribution data holder 151 and may be composed of nonvolatile semiconductor memory.

Ranking unit 143 ranks n pieces of voltages measured by voltage measuring unit 11 in order from high to low (in descending order). The voltages may be ranked in order from low to high (in ascending order). In the description hereafter, n pieces of measured voltages are ranked in descending order, for example. The timing of ranking may be in synchronization with measuring intervals by voltage measuring unit 11 or in synchronization with longer-time intervals compared to the measuring intervals. For example, measured voltages may be ranked at every measurement time or at every other measurement time.

Even among battery blocks each containing an identical number of parallel-connected battery cells with an identical capacity and identical specifications, a small difference in voltage arises from individual variation (e.g. process variation) among the battery cells and different ambient conditions (e.g. temperature variation) depending on installation locations. An element variation of the differential amplifier and the AD converter in voltage measuring unit 11 causes an error in measuring the voltages of the battery blocks. These variations are quantities characterized by the equipment and give intrinsic inequalities to measured voltages of the battery blocks. Further, the inequalities differ depending on whether the equipment is in a normal or abnormal state.

Frequency distribution data generator 144 compiles ranks assigned by ranking unit 143 to the voltages measured across respective n battery blocks B1, B2, . . . , Bn during a set period and generates data about frequency distribution of the voltage ranks. The set period is set to 10 seconds, 1 minute, or 10 minutes, for example.

SOC calculator 141 calculates an SOC value for each of battery blocks B1, B2, . . . , Bn by an open circuit voltage (OCV) method or a current integration method and outputs the SOC value to state categorizer 142. Since lithium ion batteries provide a stable relationship between SOC and OCV, SOC values of battery blocks B1, B2, . . . , Bn can be estimated from OCVs of respective battery blocks B1, B2, . . . , Bn. The current integration method enables the estimation of SOC of a battery even in charging or discharging. With SOC before the start of charging or discharging designated as an initial value, SOC at present can be estimated by adding fluctuations in SOC to the initial value using the current integration method.

State categorizer 142 categorizes states of battery blocks B1, B2, . . . , Bn at a voltage measurement time. Specifically, the state categorizer selects an applicable category among a plurality of predetermined categories. The plurality of categories are categories classified in advance according to at least one of items, i.e. SOC of battery block, battery block temperature, direction of electric current flowing through battery block, and value of electric current flowing through battery block.

FIG. 3 is a diagram illustrating an example of states 151a categorized for a battery block. In the example shown in FIG. 3, in a first categorization layer, SOC of the battery block is classified into five segments. In a second categorization layer, temperature at the battery block is classified into two ranges of low temperature and normal temperature. In a third categorization layer, direction of electric current flowing through the battery block is classified into two directions of charging and discharging. In a fourth categorization layer, the value of electric current flowing through the battery block is classified into two segments. Thus, as a whole, the battery block is categorized into 40 states. A battery block that is not charging nor discharging is classified as one case in the category of discharging. In consideration of factors such as an error in measuring electric currents, a state in which the battery block is not charging nor discharging may have a range (e.g. −100 mA to +100 mA).

The number of the layers and the number of the segments in each layer shown above are just an example. An increase in the number of the layers and/or in the number of the segments in each layer can lead to improved accuracy with which an abnormality is detected in any of the battery cells. This, however, causes an increase in throughput. Designers determine a number of layers and a number of segments in each layer for states categorized for each battery block in consideration of specifications for battery cells, uses, an installation environment, costs, and other conditions for their power storage system.

Reference frequency distribution data holder 151 in FIG. 2 holds data about frequency distribution of ranks assigned to the voltages of respective n battery blocks B1, B2, ..., Bn in the normal state as data about reference frequency distribution. Specifically, reference frequency distribution data holder 151 holds a plurality of pieces of data about reference frequency distribution generated for a plurality of states categorized for each battery block B1, B2, ..., Bn. In the case of conformance to categorized states 151a of FIG. 3, the data holder holds 40 items of data about reference frequency distribution for every battery block B1, B2, ..., Bn.

Reference frequency distribution data holder 151 may hold initial reference frequency distribution values for the plurality of states categorized for each battery block B1, B2, ..., Bn in advance. The reference frequency distribution holder may fill the items of data about reference frequency distribution with actual measured values after the start of operation. In the former, reference frequency distribution data holder 151 holds values measured or simulated under conditions of the respective categorized states as initial values in advance. In the latter, not all the items of data about reference frequency distribution for the categorized states may be filled. This, however, causes no practical problem with proviso that the items of reference frequency distribution data for categorized states necessary under the installation conditions are filled.

After the generation of data about frequency distribution of ranks assigned to the voltages of respective battery blocks B1, B2, ..., Bn, frequency distribution data generator 144 associates the generated data with states of battery blocks B1, B2, ..., Bn that are categorized by state categorizer 142 at a voltage measurement time and sent from state categorizer 142. Temporary holder 145 temporarily holds the associated data.

With frequency distribution data held in temporary holder 145, reference frequency distribution data updater 146 updates updatable data about reference frequency distribution out of reference frequency distribution data that reference frequency distribution data holder 151 holds for battery blocks B1, B2, ..., Bn by categorized state every time a predetermined updating period elapses. The predetermined updating period is set to 10 minutes, 1 hour, or 1 day, for example.

The updatable data about reference frequency distribution is pieces of frequency distribution data that are associated with categorized states and held in temporary holder 145. Reference frequency distribution data for a battery block in a categorized state is updated with frequency distribution data that temporary holder 145 holds for the identical battery block in the identical categorized state if any significant difference is not observed between the data about frequency distribution of voltage ranks and the reference frequency distribution data through a comparison process described later. Updating reference frequency distribution data in a short period of time enables the removal of influence of a degradation in a battery cell on the comparison process described later.

Reference frequency distribution data for a battery block in a categorized state is not updated with frequency distribution data for the identical battery block in the identical categorized state if a significant difference is observed between the data about frequency distribution of voltage ranks and the reference frequency distribution data through the comparison process described later. The ambient conditions may have changed substantially, or the battery block may have an abnormality. The current condition of the battery block needs to be checked without unconditional updating.

When control for equalizing n battery blocks B1, B2, ..., Bn is completed, with frequency distribution data held in temporary holder 145, reference frequency distribution data updater 146 also updates updatable data about reference frequency distribution out of reference frequency distribution data that reference frequency distribution data holder 151 holds for battery blocks B1, B2, ..., Bn by categorized state.

The control for equalization is designed to make the voltages or SOC values of n series-connected battery blocks B1, B2, ..., Bn uniform. For example, if variation among the voltages or SOC values of n battery blocks B1, B2, ..., Bn reaches a predetermined level or greater, the controller identifies a battery block with a lowest voltage or a lowest SOC value and lets the other battery blocks discharge electricity to uniform the voltages or SOC values to the lowest voltage or the lowest SOC value. Since the control for equalization is irregularly performed in response to the variation among the voltages or SOC values of n battery blocks B1, B2, ..., Bn, the updating of data about reference frequency distribution in response to completion of the equalization control takes place irregularly.

Comparator 147 compares frequency distribution data that is generated by frequency distribution data generator 144 for a battery block with reference frequency distribution data that reference frequency distribution data holder 151 holds for the battery block in a categorized state corresponding to the state of the battery block categorized at a voltage measurement time. The comparison process involves verifying whether a significant difference exists in "median" or "rank with highest frequency" between statistical populations. Alternatively, the process may involve simply comparing sample populations to determine whether or not the "medians" or "ranks with highest frequency" of frequency distributions coincide with each other. The comparison process may involve assigning weights to frequencies of frequency distributions and verifying whether or not derived representative values coincide with each other.

In response to a result of comparison by comparator 147, abnormality determiner 148 determines that any of the battery blocks is abnormal if a significant difference exists between frequency distribution data and reference frequency distribution data for the battery block in question. Abnormality determiner 148 can estimate a type of abnormality based on determination results it has previously obtained a plurality of times. For example, abnormality determiner 148 estimates that at least one battery cell in a battery block has faded or been disconnected from a parallel circuit of the block if the voltage rank shown in frequency distribution data for the abnormal battery block changes upward during charging and downward during discharging. A fade-out of a battery cell occurs because of a brake (a blown fuse, etc.) in the battery cell or a malfunction of the battery cell.

Abnormality determiner 148 estimates occurrence of a minute short circuit in at least one battery cell in a battery block if the voltage rank shown in frequency distribution data for the abnormal battery block changes downward during any of charging and discharging. The minute short circuit arises from contact between a positive electrode and a negative electrode due to displacement of a separator, the generation of a conductive path due to mixing of a foreign substance into a battery cell, or other sources. If a minute short circuit occurs in a battery cell, a conductive path is formed between the positive and the negative electrodes of the battery cell. As a result, electricity flows through the battery cell having the minute short circuit even during a halt in charging or discharging and the voltage and SOC of the battery cell decrease.

Figure 4A:
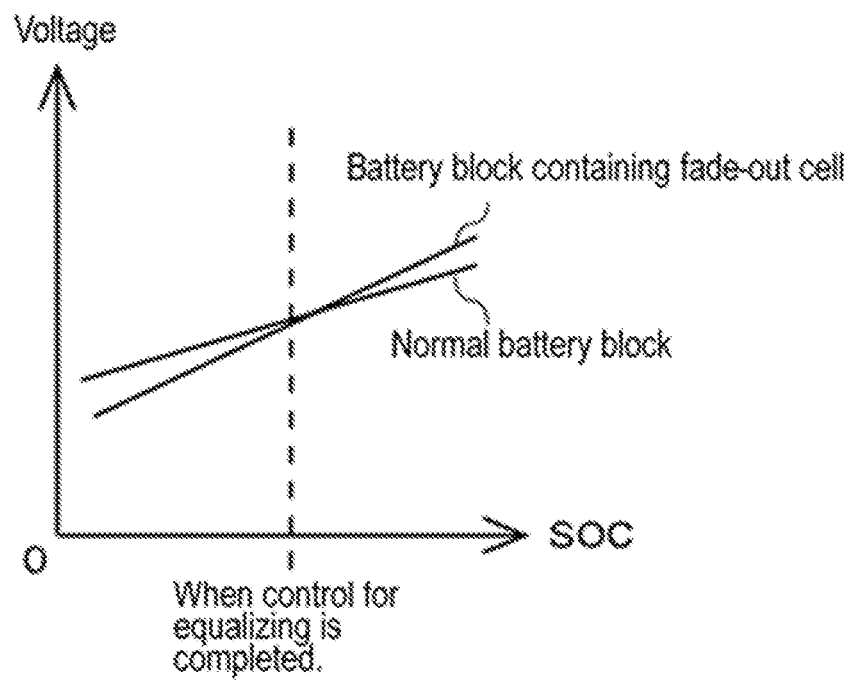
FIGS. 4A and 4B are each a graph showing relationships between state-of-charge (SOC) values and voltages of a battery block containing an abnormal cell and a normal battery block, respectively.
Figure 4B:
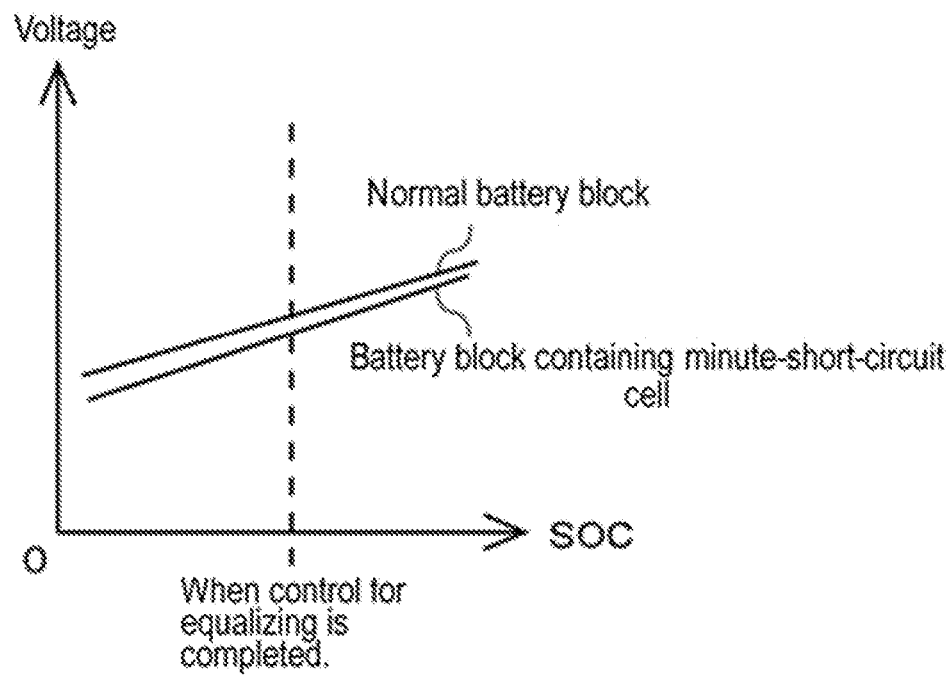

FIGS. 4A and 4B are each a graph showing relationships between SOC values and voltages of a battery block containing an abnormal cell and a normal battery block, respectively. Before generation of an abnormal cell, all the battery blocks are in any of the relationships for normal battery blocks in FIGS. 4A and 4B. FIG. 4A shows relationships between SOC values and voltages of a battery block containing a fade-out cell and a normal battery block, respectively. The battery block containing the fade-out cell has a decreased number of parallel-connected battery cells and hence has a decreased overall capacity. Thus, the battery block shows an increased overall internal resistance during any of charging and discharging. As a result, the rank assigned to the voltage of the battery block containing the fade-out cell is apt to change upward during charging and is apt to change downward during discharging. With an increase in electric current and/or a decrease in the number of the parallel connected cells, the rank changes faster.

FIG. 4B shows relationships between SOC values and voltages of a battery block containing a minute-short-circuit cell and a normal battery block, respectively. Since leakage current occurs in the battery block containing the minute-short-circuit cell, the capacity of the battery block decreases. Thus, the overall internal resistance of the battery block increases during discharging and decreases during charging. As a result, the rank assigned to the voltage of the battery block containing the minute-short-circuit cell is apt to change downward during any of charging and discharging. With an increase in electric current, the rank changes faster.

Figure 5:
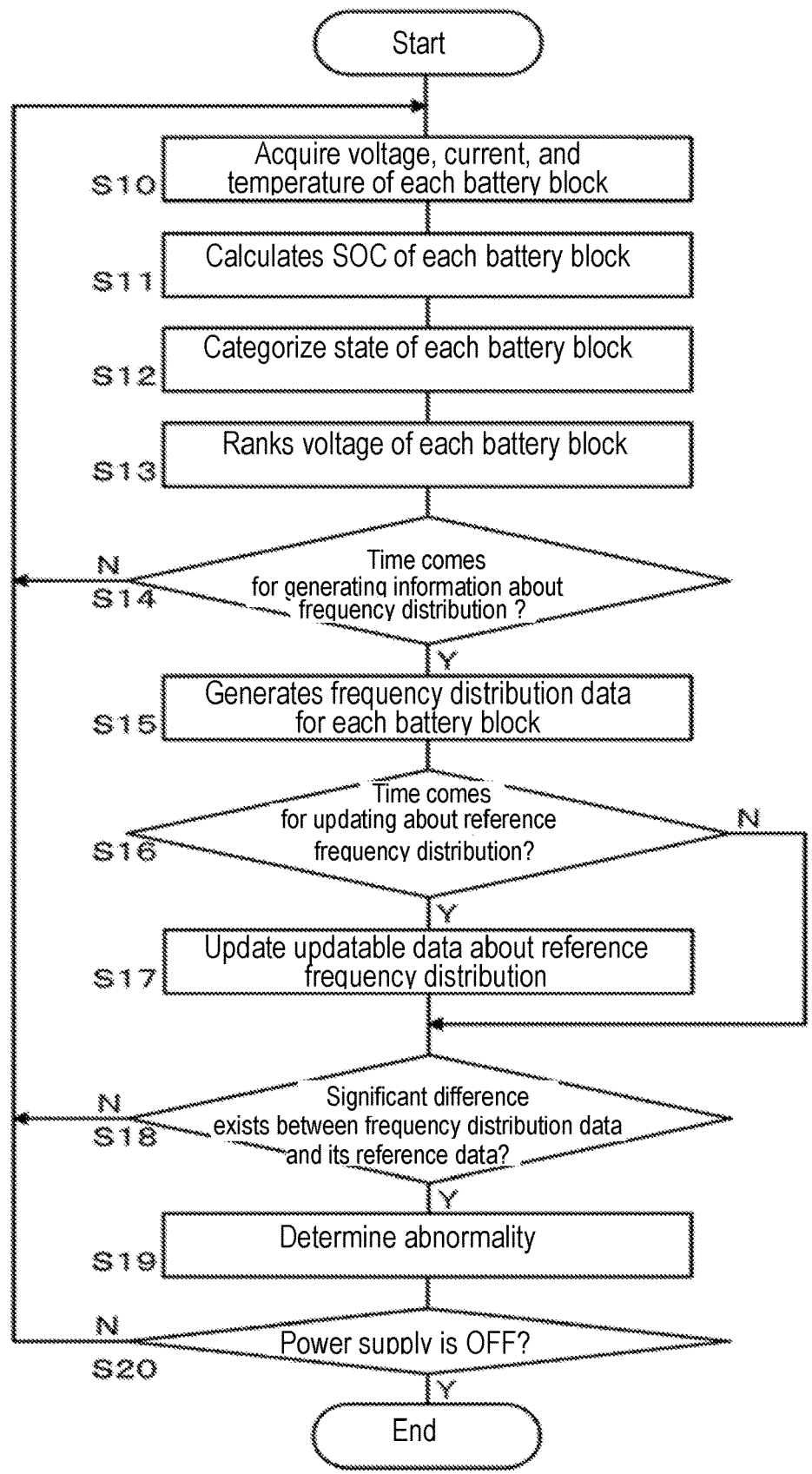
FIG. 5 is a flowchart illustrating an example procedure conducted by a battery management device according to the exemplary embodiment of the present invention.

FIG. 5 is a flowchart illustrating an example procedure conducted by battery management device 10 according to the exemplary embodiment of the present invention. Controller 14 acquires voltages, a current value, and temperatures of battery blocks B1, B2, . . . , Bn from voltage measuring unit 11, current measuring unit 13, and temperature measuring unit 12, respectively (S10). SOC calculator 141 calculates SOC values of battery blocks B1, B2, . . . , Bn based on the acquired voltages and current value (S11). State categorizer 142 categorizes states of battery blocks B1, B2, . . . , Bn based on the SOC values, the current value, and the temperatures of battery blocks B1, B2, . . . , Bn (S12).

Ranking unit 143 ranks the voltages of n battery blocks B1, B2, . . . , Bn in descending order (S13). When a time for generating information about frequency distribution comes (Y in S14), frequency distribution data generator 144 generates frequency distribution data for each battery block B1, B2, . . . , Bn (S15). While the time for generating information about frequency distribution has not come (N in S14), the battery management device repeats steps S10 to S13.

When a time for updating data about reference frequency distribution comes (Y in S16), reference frequency distribution data updater 146 updates updatable data about reference frequency distribution with frequency distribution data held in temporary holder 145 (S17). While the time for updating information about reference frequency distribution has not come (N in S16), step S17 is skipped. Reference frequency distribution data is updated at times for regular updating and at times when the control for equalization is completed.

Comparator 147 compares frequency distribution data for a subject battery block in a categorized state with reference frequency distribution data for the subject battery block in the categorized state (S18). If a significant difference exists between both pieces of the data (Y in S18), abnormality determiner 148 determines that the battery block is abnormal (S19). If any significant difference does not exist between both pieces of the data (N in S18), the battery management device makes a transition to step S10. While a power supply for battery management device 10 is turned on (N in S20), steps S10 to S19 are repeated.

As described above, the battery management device according to the present exemplary embodiment can monitor changes in ranks assigned to the voltages of the plurality of series-connected battery blocks B1, B2, . . . , Bn and thereby detect a battery block containing an abnormal battery cell. Normally, the ranks for the voltages of the plurality of battery blocks B1, B2, . . . , Bn remain constant and do not vary if no battery cell is abnormal and temperatures of the adjacent battery blocks change identically. In other words, the battery management device can estimate that a battery cell has an abnormality if the voltage ranks vary in spite of identical changes in the temperatures of the adjacent battery blocks.

A method according to the present exemplary embodiment enables detection of a battery block containing an abnormal cell in a short period of time with high accuracy as compared to conventional methods for detecting an abnormality by assessing whether or not a difference in voltage or internal resistance value exceeds a threshold. The conventional methods necessitate specifying a somewhat high threshold to avoid false detection, which results in much time taken before detection of abnormality. The method according to the present exemplary embodiment eliminates the need for specifying a somewhat high threshold and enables detection of an abnormality in a relatively short period of time. This method enables detection of an abnormality before control for equalization starts correcting a difference in voltage among battery blocks and hence avoids no detection of abnormality owing to a corrected voltage difference by the control for equalization.

The method of assessing whether or not an abnormality exists according to the present exemplary embodiment requires monitoring changes in voltage ranks only and thus eliminates the need for factoring in errors in a plurality of parameters, such as electric current and voltage, that is otherwise required in calculating internal resistances. The method according to the present exemplary embodiment allows the battery management device to estimate a type of abnormality in a battery cell based on a direction in which the voltage rank for a battery block containing the abnormal cell changes. Data about reference frequency distribution is updated in a relatively short period of time, and this helps to reduce influence of a degradation in a battery cell on the comparison process.

The present invention has been described based on the exemplary embodiment. The person of the ordinary skill in the art can understand that the exemplary embodiment is illustrative, combinations of these constitution elements and combined processes can be modified, and such modified examples fall within the scope of the present invention.

The battery management device according to the above-described exemplary embodiment ranks the voltages of all n battery blocks B1, B2, . . . , Bn forming power storage module 20. In this respect, n battery blocks B1, B2, . . . , Bn forming power storage module 20 may be classified by similar temperature into a plurality of groups so that the battery management device ranks the voltages of the groups classified by similar temperature to detect an abnormality in any of the groups.

In the exemplary embodiment described above, the power storage module includes battery blocks that each contain one or more battery cells, for example. The battery module may include power storage blocks that each contain one or more capacitor cells (e.g. electric double layer capacitor cells and lithium-ion capacitor cells).

The exemplary embodiment may be specified by items described below.

[Item 1]

Management device (10) configured to manage power storage module (20) including n power storage blocks (B1 to Bn) series-connected, where n is an integer greater than or equal to 2, each of the power storage blocks containing m power storage cells (S11 to Snm) parallel-connected, where m is an integer greater than or equal to 1, management device (10) including:

voltage measuring unit (11) to measure n pieces of voltages across n power storage blocks (B1 to Bn);

ranking unit (143) to assign ranks to the voltages measured across n power storage blocks (B1 to Bn) in descending order from high to low or in ascending order from low to high; and determiner (148) to detect an abnormality when information about the ranks differs from information about ranks for the power storage blocks in a normal state.

This configuration enables detection of a power storage block containing an abnormal power storage cell in a short period of time with high accuracy.

[Item 2]

Management device (10) according to item 1, wherein the information about the ranks is any one of a distribution of frequency of the ranks assigned to the voltages in descending or ascending order and a statistical indicator associated with the distribution of frequency.

The "statistical indicator" may be a median value, a rank with highest frequency, an average value, a variance, or a standard deviation, for example.

[Item 3]

Management device (10) according to item 1 or 2, wherein determiner (148) verifies whether or not a significant difference exists between pieces of information about the ranks.

This configuration allows a highly accurate comparison between pieces of the information about the ranks.

[Item 4]

Management device (10) according to any one of items 1 to 3, further including:

frequency distribution data generator (144) to compile ranks assigned to voltages measured across respective n power storage blocks (B1 to Bn) during a set period and generate data about frequency distribution of the ranks for the measured voltages;

reference frequency distribution data holder (151) to hold data about the frequency distribution of the ranks assigned to the voltages of respective n power storage blocks (B1 to Bn) in the normal state as data about reference frequency distribution; and comparator (147) to compare frequency distribution data that is generated by frequency distribution data generator (144) for respective power storage blocks (B1 to Bn) with reference frequency distribution data that reference frequency distribution data holder (151) holds for respective power storage blocks (B1 to Bn).

In response to a result of comparison by the comparator, determiner (148) determines that any one of the power storage blocks is abnormal on condition that a simple or significant difference exists between frequency distribution data and reference frequency distribution data for the power storage block in question.

This configuration enables detection of a power storage block containing an abnormal power storage cell in a short period of time with improved accuracy.

[Item 5]

Management device (10) according to item 4, wherein ranking unit (143) assigns ranks to voltages of n power storage blocks (B1 to Bn) in descending order, and determiner (148) estimates occurrence of an abnormality of decreased battery capacity or increased internal resistance in any of the power storage blocks when the rank in voltage shown in frequency distribution data for the abnormal power storage block changes upward during charging, and when the rank in voltage shown in frequency distribution data for the abnormal power storage block changes downward during charging, determiner (148) estimates formation of an abnormal route of a short circuit inside or outside any of the power storage blocks.

Thus, the management device can estimate a type of abnormality based on a direction in which the rank in voltage changes.

[Item 6]

Management device (10) according to item 4, wherein ranking unit (143) assigns ranks to voltages of n power storage blocks (B1 to Bn) in descending order, and determiner (148) estimates occurrence of an abnormality of decreased battery capacity or increased internal resistance in any of the power storage blocks when the rank in voltage shown in frequency distribution data for the abnormal power storage block changes upward during charging and downward during discharging, and when the rank in voltage shown in frequency distribution data for the abnormal power storage block changes downward during any of charging and discharging, determiner (148) estimates formation of an abnormal route of a short circuit inside or outside any of the power storage blocks.

Thus, the management device can estimate a type of abnormality based on a direction in which the rank in voltage changes.

[Item 7]

Management device (10) according to any one of items 4 to 6, wherein reference frequency distribution data holder (151) holds a plurality of pieces of data about reference frequency distribution generated for a plurality of states categorized for each of power storage blocks (B1 to Bn), and comparator (147) compares frequency distribution data that is generated by frequency distribution data generator (144) for any one of the power storage blocks with reference frequency distribution data for the power storage block in one of the categorized states corresponding to the state of the power storage block categorized at a voltage measurement time.

This configuration allows a highly accurate comparison in consideration of a state of a power storage block.

[Item 8]

Management device (10) according to item 7, wherein the plurality of states categorized for each of power storage blocks (B1 to Bn) are states categorized according to at least one item of state-of-charge (SOC) of the power storage block, temperature of the power storage block, direction of electric current flowing through the power storage block, and value of electric current flowing through the power storage block.

This configuration provides finely categorized states in consideration of elements that affect voltages of power storage blocks.

[Item 9]

Management device (10) according to item 8, further including:

temporary holder (145) to temporarily hold pieces of data about frequency distribution generated by frequency distribution data generator (144) for respective power storage blocks (B1 to Bn) and the states categorized for the respective power storage blocks at a voltage measurement time; and reference frequency distribution data updater (146) to update updatable data about reference frequency distribution out of reference frequency distribution data that reference frequency distribution data holder (151) holds for respective power storage blocks (B1 to Bn) by categorized state every time a predetermined updating period elapses, with use of frequency distribution data held in temporary holder (145).

The management device thus configured can remove the influence of a difference in information about reference frequency distribution due to a normal deterioration of the power storage blocks on the process of comparison taking place between frequency distribution data and reference frequency distribution data at intervals of time shorter than a span of deterioration of the power storage blocks.

[Item 10]

Management device (10) according to item 9, wherein when control for equalizing n power storage blocks (B1 to Bn) is completed, reference frequency distribution data updater (146) further updates updatable data about reference frequency distribution out of reference frequency distribution data that reference frequency distribution data holder (151) holds for respective power storage blocks (B1 to Bn) by categorized state, with use of frequency distribution data held in temporary holder (145).

Thus, the management device can update reference frequency distribution data, with the SOC values of n power storage blocks (B1 to Bn) being made uniform.

[Item 11]

Power storage system (1) including:
power storage module (20); and
management device (10) according to any one of items 1 to 10 to manage power storage module (20).

This configuration enables detection of a power storage block containing an abnormal power storage cell in a short period of time with high accuracy.

The invention claimed is:

1. A management device configured to manage a power storage module including n power storage blocks series-connected, where n is an integer greater than or equal to 2, each of the power storage blocks containing m power storage cells parallel-connected, where m is an integer greater than or equal to 1, the management device comprising:

a voltage measuring unit to measure n pieces of voltages across the n power storage blocks; and a controller including a processor and a memory storing a program, wherein the program, when executed by the processor, causes the controller to:

assign ranks to the voltages measured across the n power storage blocks in descending order from high to low or in ascending order from low to high; and detect an abnormality when information about the ranks differs from information about ranks for the power storage blocks in a normal state.

2. The management device according to claim 1, wherein the information about the ranks is any one of a distribution of frequency of the ranks assigned to the voltages in descending or ascending order and a statistical indicator associated with the distribution of frequency.

3. The management device according to claim 1, wherein the program, when executed by the processor, causes the controller to verify whether or not a significant difference exists between pieces of the information about the ranks.

4. The management device according to claim 1, wherein the program, when executed by the processor, causes the controller to:

compile ranks assigned to voltages measured across the respective n power storage blocks during a set period and generate frequency distribution data of the ranks for the measured voltages;

hold the frequency distribution data of the ranks assigned to the voltages of the respective n power storage blocks in the normal state as reference frequency distribution data;

compare the frequency distribution data for the respective power storage blocks with reference frequency distribution data for the respective power storage blocks; and in response to a result of comparison, determine that any one of the power storage blocks is abnormal on condition that a simple or significant difference exists between frequency distribution data and reference frequency distribution data for the power storage block in question.

5. The management device according to claim 4, wherein the program, when executed by the processor, causes the controller to:

assign ranks to voltages of the n power storage blocks in descending order, and estimate occurrence of an abnormality of decreased battery capacity or increased internal resistance in any of the power storage blocks when the rank in voltage shown in frequency distribution data for the abnormal power storage block changes upward during charging, and when the rank in voltage shown in frequency distribution data for the abnormal power storage block changes downward during charging, estimate formation of an abnormal route of a short circuit inside or outside the power storage block.

6. The management device according to claim 4, wherein the program, when executed by the processor, causes the controller to:

assign ranks to voltages of the n power storage blocks in descending order, and estimate occurrence of an abnormality of decreased battery capacity or increased internal resistance in any of the power storage blocks when the rank in voltage shown in frequency distribution data for the abnormal power storage block changes upward during charging and downward during discharging, and when the rank in voltage shown in frequency distribution data for the abnormal power storage block changes downward during charging and discharging, estimate formation of an abnormal route of a short circuit inside or outside the power storage block.

7. The management device according to claim 4, wherein the program, when executed by the processor, causes the controller to:

hold a plurality of pieces of data about reference frequency distribution generated for a plurality of states categorized for each of the power storage blocks, and compare frequency distribution data for any one of the power storage blocks with reference frequency distribution data for the power storage block in one of the categorized states corresponding to the state of the power storage block categorized at a voltage measurement time.

8. The management device according to claim 7, wherein the plurality of states categorized for each of the power storage blocks are states categorized according to at least one item of state-of-charge (SOC) of the power storage block, temperature of the power storage block, direction of electric current flowing through the power storage block, or value of electric current flowing through the power storage block.

9. The management device according to claim 8, wherein the program, when executed by the processor, causes the controller to:
   temporarily hold pieces of data about frequency distribution for the respective power storage blocks and the states categorized for the respective power storage blocks at a voltage measurement time; and
   a update updatable data about reference frequency distribution out of reference frequency distribution data for the respective power storage blocks by categorized state every time a predetermined updating period elapses, with use of frequency distribution data.

10. The management device according to claim 9, wherein the program, when executed by the processor, causes the controller to, when control for equalizing the n power storage blocks is completed, further update updatable data about reference frequency distribution out of reference frequency distribution data for the respective power storage blocks by categorized state, with use of frequency distribution data held.

11. A power storage system comprising:
   a power storage module; and
   the management device according to claim 1 to manage the power storage module.

* * * * *